(12) United States Patent
Wang

(10) Patent No.: US 9,318,274 B2
(45) Date of Patent: Apr. 19, 2016

(54) FABRICATION OF NANO-STRUCTURE ELECTRODES FOR ULTRA-CAPACITOR

(75) Inventor: Qingkang Wang, Shanghai (CN)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 193 days.

(21) Appl. No.: 14/117,097

(22) PCT Filed: Jul. 13, 2012

(86) PCT No.: PCT/CN2012/078612
§ 371 (c)(1),
(2), (4) Date: Nov. 12, 2013

(87) PCT Pub. No.: WO2014/008663
PCT Pub. Date: Jan. 16, 2014

(65) Prior Publication Data
US 2014/0347786 A1  Nov. 27, 2014

(51) Int. Cl.
| | | |
|---|---|---|
| *H01G 11/36* | (2013.01) | |
| *H01G 11/26* | (2013.01) | |
| *H01G 11/30* | (2013.01) | |
| *B82Y 10/00* | (2011.01) | |
| *B82Y 40/00* | (2011.01) | |
| *H01L 49/02* | (2006.01) | |
| *H01L 29/06* | (2006.01) | |
| *H01G 11/24* | (2013.01) | |
| *H01G 11/86* | (2013.01) | |
| *H01L 29/92* | (2006.01) | |

(52) U.S. Cl.
CPC ............... *H01G 11/36* (2013.01); *B82Y 10/00* (2013.01); *B82Y 40/00* (2013.01); *H01G 11/24* (2013.01); *H01G 11/26* (2013.01); *H01G 11/30* (2013.01); *H01G 11/86* (2013.01); *H01L 28/87* (2013.01); *H01L 28/91* (2013.01); *H01L 29/0673* (2013.01); *H01L 29/92* (2013.01); *Y02E 60/13* (2013.01); *Y10T 29/417* (2015.01)

(58) Field of Classification Search
CPC ............ H01L 27/1255; H01L 27/2409; H01L 27/2481; H01L 21/02601; H01L 28/56; H01L 28/87; H01L 29/0676; H01L 29/45; H01L 29/456; H01M 4/386; H01G 11/86; H01G 11/36; H01G 11/24; H01G 11/28; H01G 11/30; H01G 11/26; H01G 11/70; H01G 11/22; H01G 11/68
See application file for complete search history.

(56) References Cited

U.S. PATENT DOCUMENTS

2010/0097742 A1  4/2010  Adzic et al.
2011/0204020 A1 *  8/2011  Ray et al. .................... 216/13
(Continued)

FOREIGN PATENT DOCUMENTS

| CN | 101635201 A | | 1/2010 | |
|---|---|---|---|---|
| CN | 102509637 A | | 6/2012 | |
| WO | WO 2011118878 | * | 9/2011 | ............ C08F 297/00 |

OTHER PUBLICATIONS

Kuiqing Peng et al., "Aligned Single-Crystalline Si Nanowire Arrays for Photovoltaic Applications", Small Journal, 2005, pp. 1062-1067, vol. 1, No. 11, Wiley InterScience.

(Continued)

*Primary Examiner* — Dion R Ferguson
(74) *Attorney, Agent, or Firm* — Ren-Sheng International

(57) ABSTRACT

Techniques described herein generally relate to the fabrication of ultra-capacitor. In one or more embodiments of the present disclosure, methods for fabricating an ultra-capacitor are described that may include preparing a substrate surface of a silicon wafer. The methods may further include etching one or more nano-structures on the substrate surface of the silicon wafer with a galvanic displacement process, and constructing electrodes for the ultra-capacitor from the silicon wafer with the one or more nano-structures.

14 Claims, 5 Drawing Sheets

(56) References Cited

U.S. PATENT DOCUMENTS

2012/0003711 A1* 1/2012 Tseng et al. .................. 435/177
2013/0012022 A1* 1/2013 Hung et al. .................... 438/680
2013/0020278 A1* 1/2013 Park et al. ....................... 216/11

OTHER PUBLICATIONS

"125 Mono Solar Wafer", <retrieved on Nov. 17, 2010>, Retrieved from the Internet at < URL: http://www.alibaba.com/product-gs/319231342/125_mono_solar_wafer.html>.

Calvin P. Darosa et al., "Copper Deposition Onto Silicon by Galvanic Displacement: Effect of Silicon Dissolution Rate", Journal of the Electrochemical Society, 2008, pp. E70-E78, vol. 155, No. 6.

"Singlewall Carbon Nanotubes Produced by CVD Method", <retrieved on Nov. 17, 2010>, Retrieved from the Internet at < http://www.nano-lab.com/singlewall-nanotubes.html>, Updated on Sep. 17, 2010.

Notification of Transmittal of the International Search Report and the Written Opinion of the International Searching Authority, PCT/CN2012/078612, Apr. 11, 2013.

Jang Wook Choi et al., "Stepwise Nanopore Evolution in One-Dimensional Nanostructures", NANO Letters, Mar. 25, 2010, pp. 1409-1413, vol. 10, No. 4.

Richard Ball, "Supercapacitors See Growth as Costs Fall", Wayback Machine, Mar. 1, 2006, pp. 1-2, accessed at <URL: http://web.archive.org/web/20110923014307/http://www.electronicsweekly.com/Articles/2006/03/03/37810/Supercapacitors-see-growth-as-costs-fall.htm> on Jan. 15, 2015.

* cited by examiner

FABRICATION OF NANO-STRUCTURE ELECTRODES FOR ULTRA-CAPACITOR

CROSS REFERENCE TO RELATED APPLICATION

The present application is a U.S. National Stage filing under U.S.C. §371 of International Application PCT/CN2012/078612, filed on Jul. 13, 2012 and entitled "FABRICATION OF NANO-STRUCTURE ELECTRODES FOR ULTRA-CAPACITOR." The International Application, including any appendices or attachments thereof, is hereby incorporated by reference in its entirety.

BACKGROUND

Unless otherwise indicated herein, the approaches described in this section are not prior art to the claims in this application and are not admitted to be prior art by inclusion in this section.

An electric double-layer capacitor may utilize nano-structures to increase the effective surface areas of electrodes. The electric double-layer capacitor can be conventionally constructed either based on an activated carbon material used for the porous electrodes of the capacitor, or using carbon nano-tubes as the electrodes for the capacitor. The electrodes made out of the activated carbon material often may have insufficient surface areas. On the other hand, the adoption of carbon nano-tubes as electrodes may be limited by costs and technical deficiencies. For instance, it is technically difficult to massively and evenly grow the carbon nano-tubes on a wafer. Also, it may be hard for the electrolyte to infiltrate the highly dense carbon nano-tubes. Further, mass-producing the double-electrode capacitors in conventional approaches may incur high manufacturing costs.

SUMMARY

Techniques described herein generally relate to the fabrication of ultra-capacitor. In one or more embodiments of the present disclosure, methods for fabricating an ultra-capacitor are described that may include preparing a substrate surface of a silicon wafer. The methods may further include etching one or more nano-structures on the substrate surface of the silicon wafer with a galvanic displacement process, and constructing electrodes for the ultra-capacitor from the silicon wafer with the one or more nano-structures.

In one or more embodiments of the present disclosure, methods for constructing an electric double-layer ultra-capacitor are described that may include preparing a substrate surface of a silicon wafer. The method may include etching one or more nano-structures on the substrate surface of the silicon wafer with a galvanic displacement process. The one or more nano-structures may contain silicon nano-wires with a height-to-diameter ratio that is above a first predetermined threshold. The method may further include constructing the double-layer ultra-capacitor using two wafer segments from the silicon wafer. Each of the wafer segments may contain a respective subset of silicon nano-wires.

In one or more embodiments of the present disclosure, an electric double-layer ultra-capacitor may include a first electrode and a second electrode that are configured in cooperative operation as electrodes in the electric double-layer ultra-capacitor. Each of the first electrode and the second electrode may have a respective nano-structure that contains a plurality of nano-wires configured with a height-to-diameter ratio that is above a first predetermined threshold. The first electrode's nano-structure and the second electrode's nano-structure may be configured to face each other, where a distance between the first electrode's nano-structure and the second electrode's nano-structure is smaller than a second predetermined threshold.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
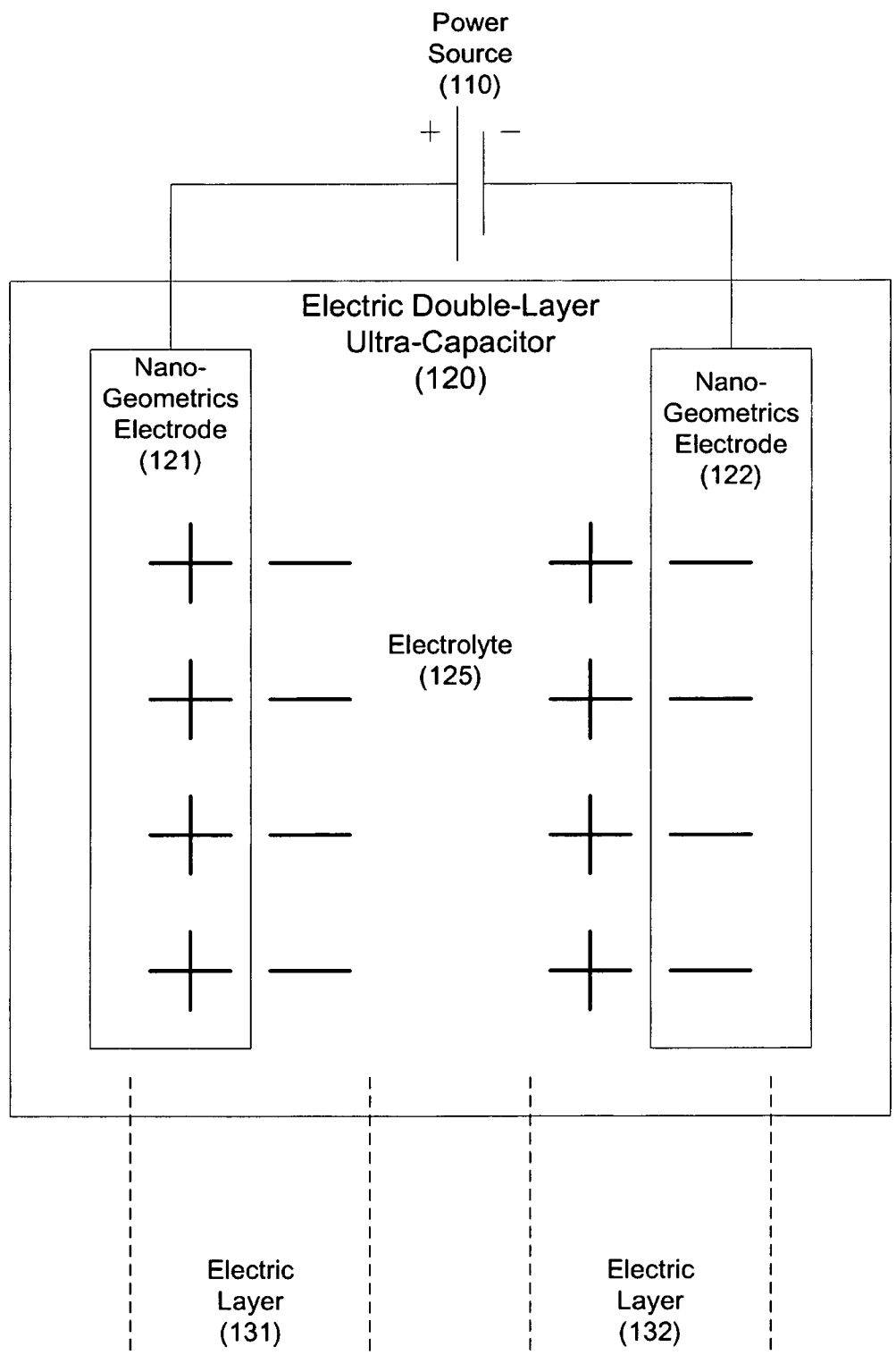
FIG. 1 shows an example electric double-layer ultra-capacitor having nano-structure electrodes.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated herein.

This disclosure is generally drawn, inter alia, to fabrication of nano-structure electrodes for ultra-capacitors. Throughout the disclosure, the term "galvanic displacement process" may broadly refer to a semiconductor fabrication process for depositing thin films, silicon, metal, and/or other semiconductor nano-particles, on a surface or a substrate. In some embodiments, a galvanic displacement process may be used to effectively deposit silicon particles on a silicon substrate for constructing a silicon nano-structure that has strong tensile strength.

The present disclosure presents some embodiments of electrochemical methods for fabrication of high geometry-factor nano-structure electrodes that are designed for electric double-layer ultra-capacitors. By adopting the galvanic displacement process, the constructed electrodes may have large electrode surface areas and long electrode service life. Further, the fabrication process described herein may be used for manufacturing high geometry-factor nano-structures in a large scale and at a low cost.

FIG. 1 shows an example electric double-layer ultra-capacitor having nano-structure electrodes, in accordance with at least some embodiments of the present disclosure. In FIG. 1, the electric double-layer ultra-capacitor 120 may have two polarizable nano-geometrics electrodes 121 and 122, which can be coupled to the positive end and the negative end of an external power source 110, respectively. The power source 110 may be configured to provide electric power to the electrodes 121 and 122, effective to cause a collection of positive charges at the electrode 121 and a collection of negative charges collected at the electrode 122. The positive and the negative charges may be reversed, where the electrode 121 may be connected to the negative end of the external power source 110, and the electrode 122 may be connected to the positive end of the external power source 110. In some embodiments, the nano-geometrics electrodes 121 and 122 may be separated by electrolyte 125. Electrolyte 125 may be a liquid or semi-liquid electrolyte solution.

In some embodiments, the electric double-layer ultra-capacitor 120 may be configured with two or more nano-geometrics electrodes 121 and 122, with the electrolyte 125 being filled in a space between the two electrodes. When voltage from the power source 110 is applied to the electric double-layer ultra-capacitor 120, positive and negative electric charges may respectively be aggregated on these two opposite and porous nano-geometrics electrodes 121 and 122, creating an electric field. Affected by this electric field, the positive and negative ions in the electrolyte 125 may be aggregated on the opposite surfaces of the positive and negative nano-geometrics electrodes 121 and 122 respectively, which may result in the formation of two electric layers 131 and 132, equivalent to two conventional capacitors being serial-connected to one another.

In some embodiment, the total capacitance of the electric double-layer ultra-capacitor 120 may result from the two or more separated polar plates or electrodes. The multiple polar plates/electrodes may be separated by, or have in between, a vacuum (with a relative dielectric constant being 1), or a dielectric substance (which has a relative dielectric constant "∈"). The capacitance value "C" for an electric double-layer ultra-capacitor 120 may be shown by the following equation:

$$C = (\in *A/(3.6*\pi *t))*10^{-6} (\mu F) \quad \text{(Eq. 1)}$$

where "A" refers to the surface area provided by the polar plates/electrodes, and "t" refers to dielectric thickness. The capacitance value "C" may be measured in farad (F) or microfarad (μF). And the electric energy "E" stored in the electric double-layer ultra-capacitor 120 may be calculated as:

$$E = 1/2 C(\Delta V)^2 \quad \text{(Eq. 2)}$$

where "C" is the capacitance value calculated by the above Equation 1, and "ΔV" refers to the voltage drop among the multiple polar plates/electrodes. Based on the above equations (Eq. 1 and Eq. 2), the capacitance value of an electric double-layer ultra-capacitor may be raised by either increasing the surface area "A", and/or reducing the dielectric thickness "t."

In some embodiments, the electric double-layer ultra-capacitor 120 may achieve an ultra-high capacitance by increasing the surface areas of the electrodes, and/or by reducing the distance between the polarized electrodes. Electrodes having ultra-high surface areas may be constructed using porous structures. The distance between the polarized electrodes may be reduced by decreasing the thickness of the electrolyte in between the polarized electrodes, or by placing the polarized electrodes as close to each other as possible. For example, when the distance between the electrolyte solution 125 and the porous electrodes 121 and 122 is less than 1 μm, based on the formula 1 shown above, the capacitance value of this electric double-layer ultra-capacitor 120 can be increased by several orders of magnitude, comparing to conventional capacitors.

Therefore, by adopting of porous electrodes that have nano-structures with ultra-high surface areas, and/or in the using of electrolytes with high dielectric efficiency, the capacitance of the electric double-layer ultra-capacitor 120 may be significantly improved. The nano-structures that can greatly improve the effective surface area of electrode may require the use of a specific nano-structure manufacturing technique such as the galvanic displacement process described below.

Figure 2:
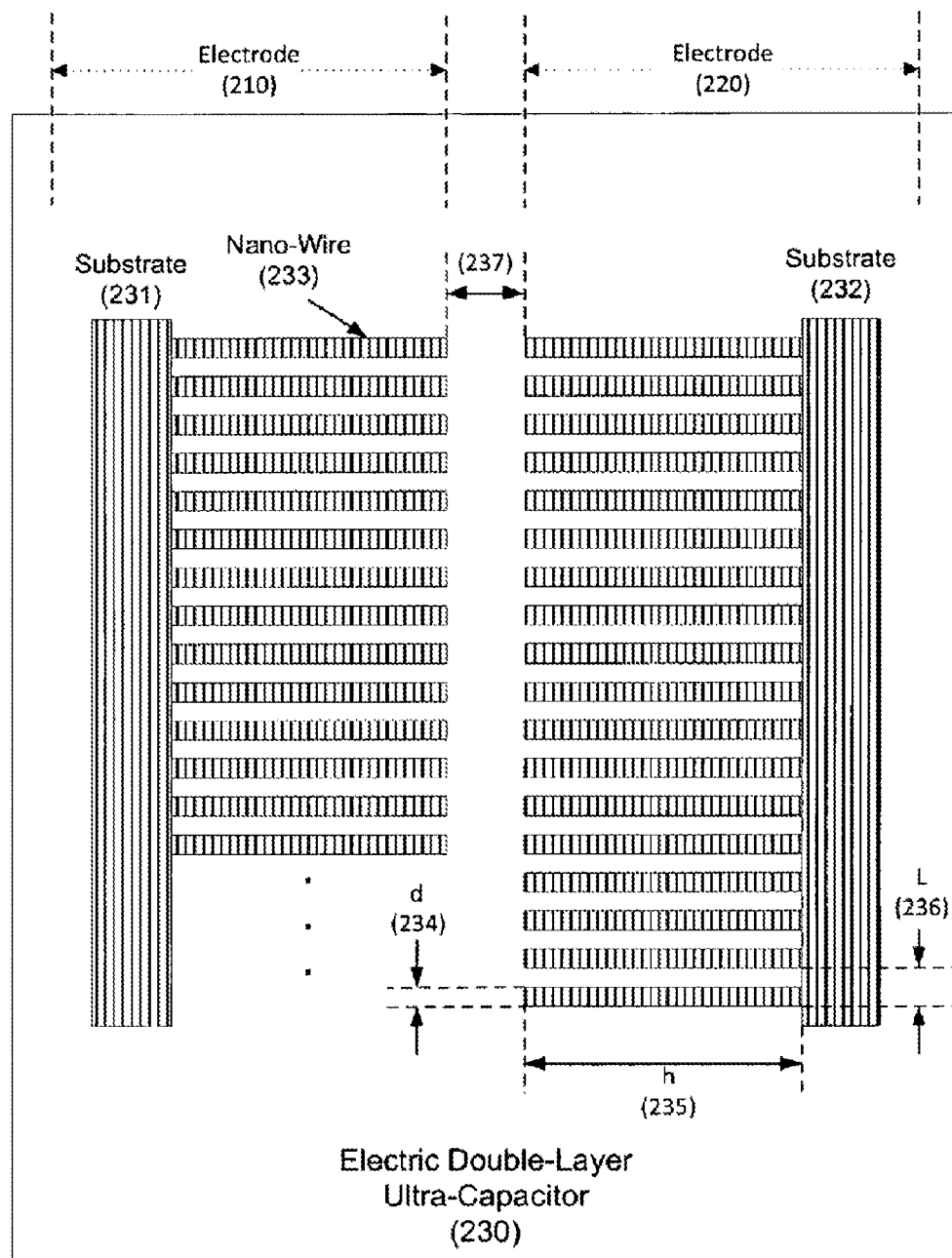
FIG. 2 shows an example electric double-layer ultra-capacitor with electrodes being constructed using galvanic displacement process.

FIG. 2 shows an example electric double-layer ultra-capacitor with electrodes constructed using a galvanic displacement process, in accordance with at least some embodiments of the present disclosure. In FIG. 2, an electric double-layer ultra-capacitor 230, which is similar to the electric double-layer ultra-capacitor 120 of FIG. 1, may have two electrodes 210 and 220. Each of the electrodes 210 and 220 may have multiple nano-wires 233 formed on the basis of substrates 231 and 232. Specifically, the nano-wires 233 may be etched out of a part of the semiconductor substrates 231 and 232 using the galvanic displacement process described herein. In some embodiments, the semiconductor substrates 231 and 232 may be silicon-based substrates that may be comprised of a portion of a silicon wafer. An example silicon wafer may be formed using semiconductor materials such as silicon or germanium. The nano-wires 233 that are formed on the base of the substrates 231 and 232 may be in a same material such as silicon. In this case, the silicon nano-wires 233 are seamlessly integrated with the silicon substrates 231 and 232, as the nano-wires 233 are a part of the substrate 231 and 232 before the galvanic displacement process. As a result, the electrodes 210 and 220 may have a strong tensile strength as the connections between the nano-wires 233 and the silicon substrates 231 are not affected by the galvanic displacement process.

In some embodiments, the silicon substrates 231 and 232 may be based on highly-doped silicon wafer having a sheet resistance that is below about 10Ω/□. The silicon nano-wires 233 may be deemed a high geometric-factor nano-structure when the nano-wires 233 have a height-to-diameter ratio that is approximately 100:1 or above. By using electroplating or electro-less plating techniques such as the galvanic displacement process, the nano-wires 233 may be formed on the bases of the substrates 231 and 232 in a larger scale and at a lower cost when compared to conventional etching processes. The nano-wires 233 may provide ultra-high surface areas for the electrodes 210 and 220. Specifically, the surface areas of the electrodes 210 and 220 may include external surface areas and internal surface areas of the nano-wires 233. The "external" surface areas may be the outer surface of the nano-wires 233. The "internal" surface areas may include the surface areas of the porous holes and pits in the nano-wires 233. Therefore, the nano-wires 233 may increase the surface areas of the electrodes 210 and 220 by a factor range from approximately ten to hundreds.

In some embodiments, the nano-wires 233 may allow the electrodes 210 and 220 to be positioned very close (around 0.5 μm-1 μm) to each other, effectively reducing the distance (237) between the opposing electrodes 210 and 220 and also reducing the thickness of the electrolyte layer or electrolyte solution (not shown in FIG. 2) between the two electrodes 210 and 220.

In some embodiments, a geometry factor F, which is related to the surface area of the electrode 210 and 220, may be calculated based on the following equation 3:

$$F = \frac{\text{surface area of the electrode that contacts the electrolyte}}{\text{macro area of the electrode}} \quad \text{(Eq. 3)}$$

The "macro area of the electrode" may refer to the geometric surface areas of the nano-wires. That is, the macro area of the electrode may be calculated by treating the nano-wires as geometric cylinders that have smooth surface areas. The "surface area of the electrode that contacts the electrolyte" may include all the surface areas of the nano-wires exposed to the electrolyte. These surface areas may include the "macro area of the electrode" as well as the surface areas that are exposed by porous holes and pits in the nano-wires.

An example nano-wire 233 may have a substantially cylindrical shape, with a height (235) denoted h, a diameter (234) denoted d, and a periodical length (a minimum distance between two neighboring nano-wires, including one of the nano-wire's width) (236) denoted L. The geometry factor F may be calculated by the following equation 4:

$$F=((3.14*d*h)+L^2)/L^2=(3.14*d*h)/L^2+1 \, a<L \quad \text{(Eq. 4)}$$

When d is approximately equal to L/2, then the above equation 4 may become $$F=1+(3.14*h*4)/L \quad \text{(Eq. 5)}$$

Based on the above equations 4 and 5, when the value of h/L is sufficiently high, the nano-wire 233 may be deemed to have an ultra-high surface area when the geometric factor is higher than about 100. For example, a nano-wire 233 may have the following geometric measurements:

$$L=500 \text{ nm}, d=200 \text{ nm}, h=10000 \text{ nm}.$$

Based on equations 4 and 5, the geometry factor F may then be calculated to be $$F=1+251.2=252.2$$

Further, the diameter d may have a value ranging from about 100 nm to about 500 nm; the height h may have a value ranging from about 500 nm to about 10000 nm, and the periodical length L may have a value ranging from about 200 nm to about 500 nm.

Thus, the nano-structure electrodes 210 and 220 formed by the nano-wires 233 of the present disclosure may yield an increased surface area of the electrode by approximately 250 folds compared to a conventional electrode that takes up a substantially similar amount of volume. Moreover, the capacitance of the electric double-layer ultra-capacitor 230 of the present disclosure can be realized with several thousands of farads of capacitance, which is approximately 100 fold greater in capacitance value compared with conventional electric double-layer capacitors.

In some embodiments, the nano-wires 233 may be formed on a highly-doped silicon wafer by using the galvanic displacement process. The nano-wires 233 formed on the may have a high height-to-diameter ration and high concentration rate as described below. The generated nano-wires 233 of the present disclosure may realize an ultra-high h/L ratio that reaches approximately 100 and above. The concentration rate of the nano-wires 233 may be controlled in the galvanic displacement process. The galvanic displacement process can also be applied in a large scale and at a low cost. The electric conductivity of the electrodes formed by the nano-wires 233 may be further improved by an electroplating technique that uses metal materials such as Nickel or Copper. After plating, the silicon wafer with the nano-wires 233 may be used as an electrode for the electric double-layer ultra-capacitors 230.

Figure 3:
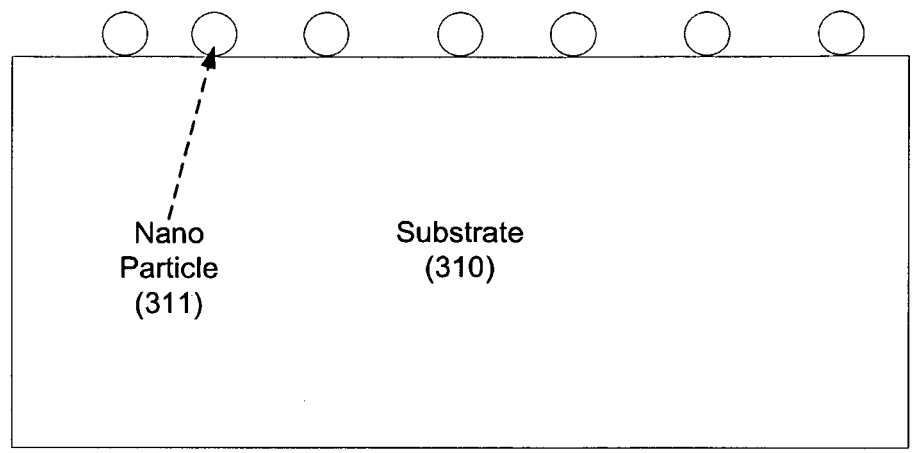
FIG. 3 illustrates example embodiments of constructing nano-structures with a galvanic displacement process.
Figure 3:
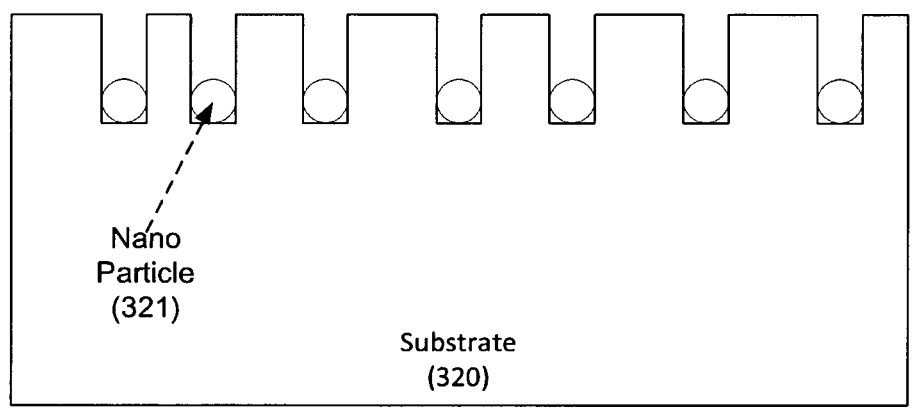
Figure 3:
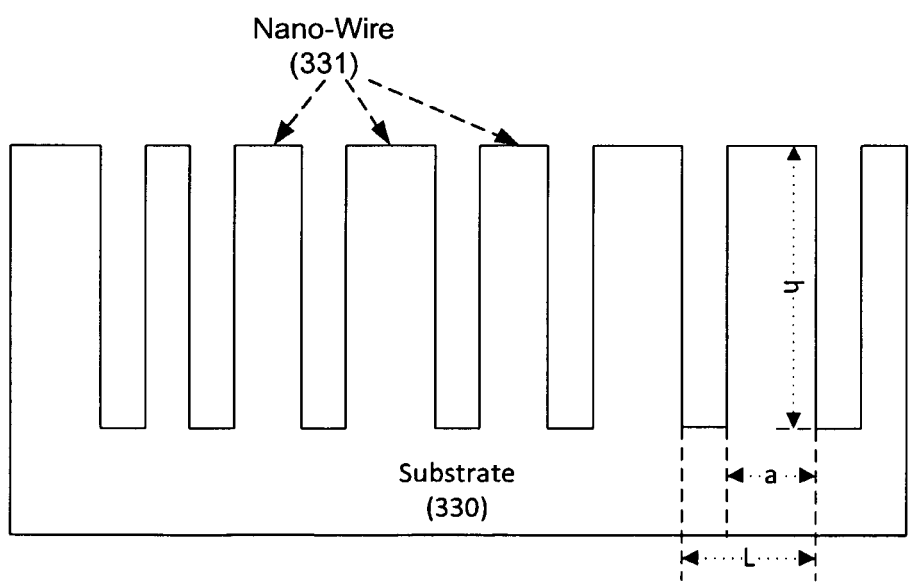

FIG. 3 illustrates an example construction of nano-structures with a galvanic displacement process, in accordance with at least some embodiments of the present disclosure. In FIG. 3, substrates 310, 320, and 330 illustrates various stages of nano-structures being etched by the galvanic displacement process. In some embodiments, the substrates 310, 320, and 330 may be immersed under a galvanic displacement solution that contains silver nitrate ($AgNO_3$), hydrofluoric acid (HF), and/or nitric acid ($HNO_3$).

In some embodiments, a substrate 310 is first submerged in the above galvanic displacement solution under a room temperature (e.g., below approximately 50 degree Celsius), and a thin layer of metal (e.g., silver Ag) nano-particles 311 may be deposited onto the surface of the substrate 310. By controlling the mixing ratio of the various components in the galvanic displacement solution, the concentration of the metal nano-particles 311 on the surface of the substrate 310 may be adjusted. The galvanic displacement solution may then be utilized to etch the substrate materials (e.g., silicon) around the close vicinities of the nano-particles 311, which in turn facilitates the nano-particles 311 sinking into the substrate 310. By the elapse of etching time, the galvanic replacement process may leave deeper pits on the substrate surface and effectively form the nano-structures as illustrated by the substrate 320. Further, the metal nano-particles 321 may be isolated in the deepening pits, allowing the continuous etching of the substrate materials around the close vicinities of the nano-particles 321.

In some embodiments, the substrate 330 may show a final result after the galvanic displacement process is completed. The distance L between two nano-wires 331 may be related to the distance between two metal nano-particles 311. The height h of the nano-wires 331 may be controlled based on the time of the substrate 330 being submerged in the galvanic displacement solution. That is, the longer the galvanic displacement process, the taller the height h of the nano-wires 331. Further, the longer the galvanic displacement process, the more substrate material may be etched out, leaving a thinner diameter d of the nano-wires 331. Since the nano-wires 331 are originally part of the substrate 330, the strength of the nano-wires 331 may be higher than nano-structures that are not part of, but deposited onto, the surface of the substrate 330.

Figure 4:
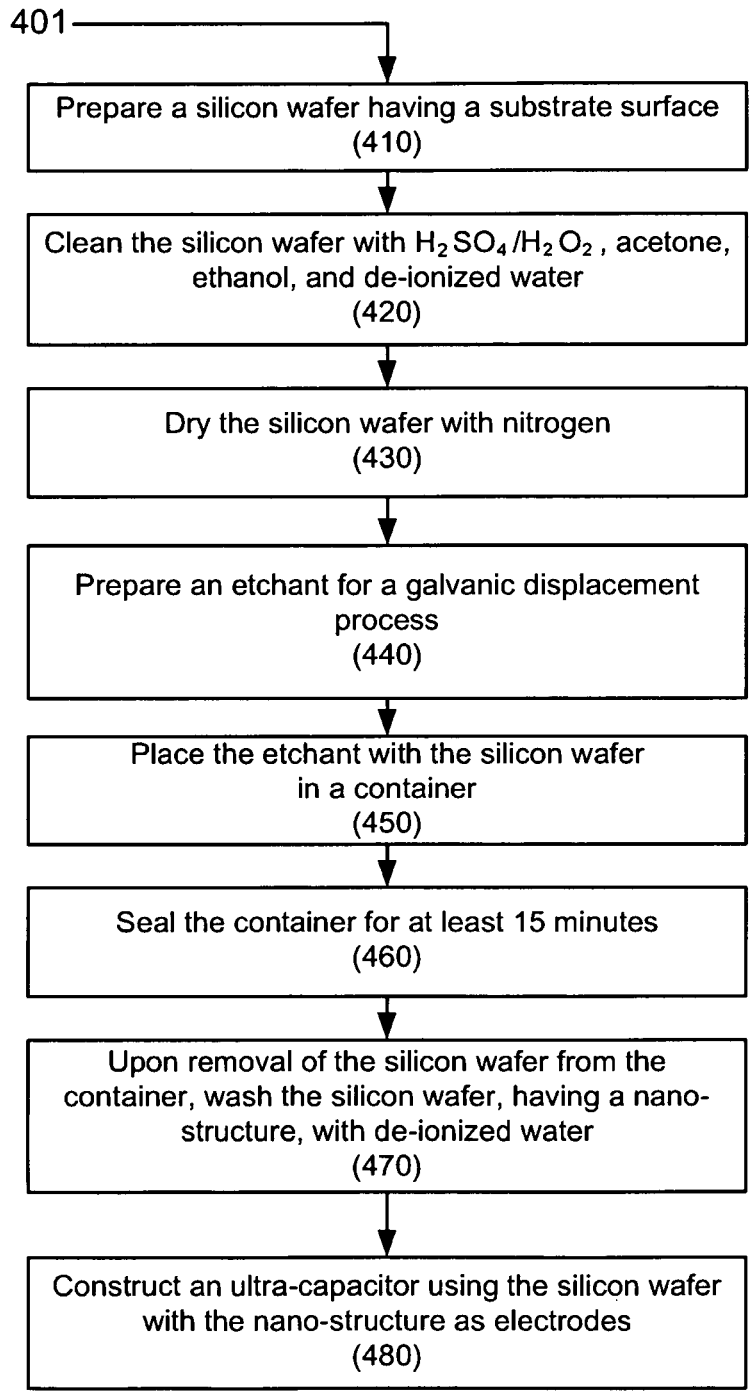
FIG. 4 shows an illustrative embodiment of a process for fabricating of an electric double-layer ultra-capacitor using the galvanic displacement process.

FIG. 4 shows a flow diagram of an illustrative embodiment of a process 401 for fabricating of an electric double-layer ultra-capacitor using the galvanic displacement process as described herein. The described process 401 sets forth various functional blocks or actions that may be described as processing steps, functional operations, events, and/or acts, as illustrated by one or more of blocks 410, 420, 430, 440, 450, 460, 470, and/or 480. The various blocks may be performed by hardware, software, firmware, or a combination thereof.

Those skilled, in the art in light of the present disclosure, will recognize that numerous alternatives to the blocks shown in FIG. 4 may be practiced in various implementations. For this and other processes and methods disclosed herein, the functions performed in the described processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments. Also, one or more of the outlined steps and operations may be performed in parallel.

In some embodiments, the process 401 may correspond to an electrochemical method based on the galvanic displacement process. The chemical materials needed for the galvanic displacement may include, without limitation, pure chemical reagent for analysis silver nitrate ($AgNO_3$), hydrofluoric acid (HF, >40%), and nitric acid (65%~68%).

Process 401 may begin at block 410. At block 410, a silicon wafer having a silicon substrate surface is utilized in the galvanic displacement process. In some embodiments, the silicon wafer may be a highly-doped mono-crystalline silicon wafer with P-type orientation. The silicon wafer may have a sheet resistance in a range approximated between about $5\Omega/\square$ and about $10\Omega/\square$. Block 410 may be followed by block 420.

At block 420, a cleaning machine may clean the silicon wafer, such as a machine configured to apply $H_2SO_4/H_2O_2$, analytical pure acetone, analytical pure ethanol and de-ionized water to the silicon wafer. The de-ionized water may have a sheet resistance of about $18\ M\Omega/\square$. In some embodiments, the cleaning process may take approximately 10 minutes. Block 420 may be followed by block 430.

At block 430, a drying machine may be utilized to air-dry the cleaned silicon wafer. In some examples, the drying machine can be configured to use a gas such as nitrogen to air-dry the silicon wafer at room temperature. Block 430 may be followed by block 440.

At block 440, an etchant for the galvanic displacement process may be prepared. In some examples the etchant can be prepared using a mixing ratio of 35 mM/L ($10^{-3}$ Mole/Liter) of $AgNO_3$ with 20% HF. Block 440 may be followed by block 450.

At block 450, the etchant prepared at block 440 may be placed inside a Teflon container by a deposition machine. Block 450 may be followed by block 460.

At block 460, the deposition machine may immerse/submerge the cleaned silicon wafer into the etchant in the Teflon container. The Teflon container may be sealed to promote a galvanic displacement reaction. The galvanic displacement reaction may be performed for approximately 15 minutes at room temperature. The longer the silicon wafer is immersed in the etchant, the longer and denser the nano-wires may be formed on the substrate of the silicon wafer. Block 460 may be followed by block 470.

At block 470, the silicon wafer may be removed from the Teflon container. The residual etchant for galvanic displacement that remains on the silicon wafer may be washed away by a fluid (e.g. de-ionized water) from a cleaning machine. The silicon wafer may subsequently be immersed in a cleaning solution such as dilute nitric acid, and sealed for approximately 2 hours for further removal of residual etchant from the surface of the silicon wafer. Block 470 may be followed by block 480.

At block 480, the silicon wafer may be removed from the cleaning solution (e.g., the dilute nitric acid), cleaned with a fluid (e.g., de-ionized water) by the cleaning machine, and blown dry (e.g., with nitrogen at room temperature) by the drying machine. Thus, the resulting silicon wafer may contain one or more nano-structures having nano-wires on the bases of the substrate.

In some embodiments, a dicing machine may be configured to dice the silicon wafer into multiple wafer segments, where each wafer segment may be utilized as an electrode for an ultra-capacitor. Each wafer segment may contain a concentration of nano-wires each of which has a sufficient height-to-diameter ratio that is above a predetermined threshold (e.g., a threshold ratio of 100:1).

In some embodiments, a packaging machine may be configured to select two wafer segments, and package the two wafer segments as electrode for an ultra-capacitor. In the packaged ultra-capacitor, the wafer segments each have a respective nano-structure side positioned to face each other. That is, the nano-wires on the wafer segments are positioned close to each other, as illustrated by FIG. 2. The distance between the nano-wires of the two electrodes may be below a predetermined threshold (e.g., a threshold distance from about 0.5 μm to about 1 μm). An electrolyte material or solution may be filled in the gap between the electrodes, where the resulting ultra-capacitor may be sealed (or encapsulated) in a plastic or metal container as a final product.

Figure 5:
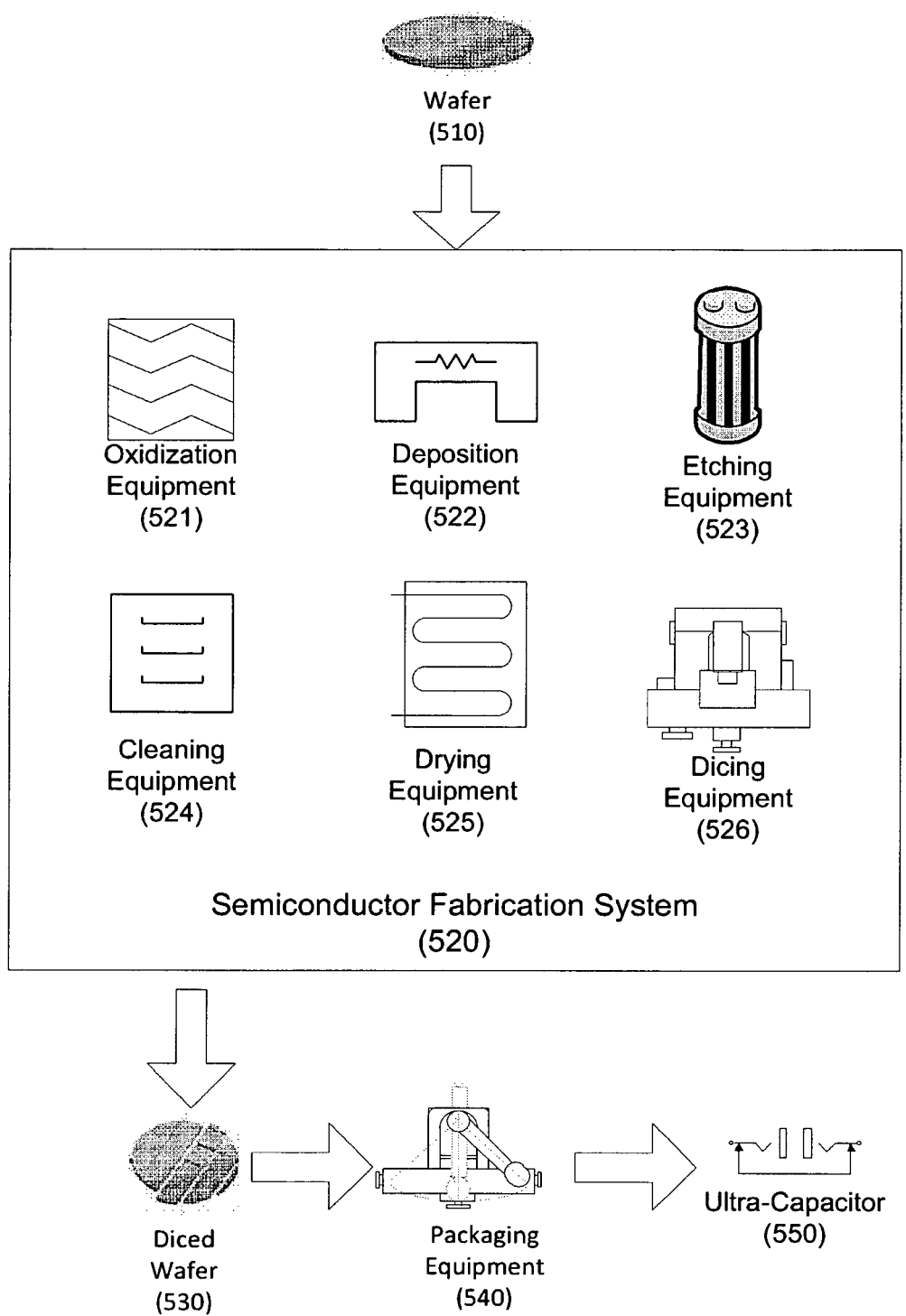
FIG. 5 illustrates example embodiments of a semiconductor fabrication system in an operational environment, all arranged in accordance to at least some embodiments of the present disclosure.

FIG. 5 illustrates an example semiconductor fabrication system in an operational environment, all arranged in accordance to at least some embodiments of the present disclosure. As shown in FIG. 5, a semiconductor fabrication system 520 may contain equipment arranged for fabricating a wafer 510 for use in ultra-capacitors 550. The semiconductor fabrication system 520 may include, without limitation, oxidation equipment 521, deposition equipment 522, etching equipment 523, cleaning equipment 524, drying equipment 525, and dicing equipment 526. A wafer 510, which may be a thin slice of semiconductor material (e.g., silicon crystal), may be processed by the above equipment one or more times based on the operation routes, the end product's specifications and the manufacturing recipes. In some embodiments, the wafer 510 may be a p-type highly doped semiconductor wafer.

In some embodiments, the oxidization equipment 521 may be equipment configured to perform one or more of thermal oxidation, wet anodization, chemical vapor deposition (CVD), and/or plasma anodization or oxidation operations. The oxidation equipment 521 may be adapted to oxidize the surface of the wafer 510 in order to form a layer of silicon dioxide, if necessary.

The deposition equipment 522 may be configured to deposit a layer of specific material over the wafer 510. In some embodiments, a galvanic displacement process may be employed to deposit a nano-structure of silicon material with a high surface area over the wafer 510.

The etching equipment 523 may be configured to perform one or more of wet-etching, dry-etching, or plasma-etching processes that are adapted to remove portions of semiconductor layers from the wafer 510.

The cleaning equipment 524 may be configured to rinse and clean the surface of semiconductor components after one or more of the deposition, etching, and/or dicing operations.

The drying equipment 525 may be configured to dry the semiconductor components by applying air (e.g., ambient air, or a gas such as nitrogen) or heat over sufficient elapse time to dry the surface of the semiconductor components.

The dicing equipment 526 may be configured to dice a fabricated silicon wafer into a diced wafer 530. The diced wafer 530 may be deemed wafer segments, each of which may be used as a portion of a finished product. The wafer segments may then be positioned and packaged by a packaging equipment 540, and a final product, such as ultra-capacitor 550 may be generated.

Thus, methods and systems for constructing a nano-structure ultra-capacitor have been described. Although the present disclosure has been described with reference to specific example embodiments, it will be recognized that the disclosure is not limited to the embodiments described, but can be practiced with modification and alteration within the spirit and scope of the appended claims. Accordingly, the specification and drawings are to be regarded in an illustrative sense rather than a restrictive sense.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In some embodiments, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory; and a transmission type medium such as a digital and/or an analog communication medium (e.g., a fiber optic cable, a waveguide, a wired communications link, a wireless communication link).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or coupled with, different other components. It is to be understood that such depicted architectures are merely examples and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to"). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

I claim:

1. A method for constructing an electric double-layer ultra-capacitor, comprising:
preparing a substrate surface of a silicon wafer;
etching one or more nano-structures on the substrate surface of the silicon wafer with a galvanic displacement process, wherein the one or more nano-structures contain silicon nano-wires with a height-to-diameter ratio that is above a first predetermined threshold of about 100:1; and
constructing the double-layer ultra-capacitor using two wafer segments from the silicon wafer as two electrodes, wherein each of the wafer segments contain a respective subset of silicon nano-wires, the constructing comprising:
positioning the two wafer segments having their respective subset of nano-wires facing each other, wherein a distance between the two respective subsets of nano-wires is smaller than a second predetermined threshold of about 0.5 µm; and
configuring the two wafer segments as the two electrodes for the double-layer ultra-capacitor.

2. The method as recited in claim 1, wherein the preparing the substrate surface of the silicon wafer comprises:
cleaning the surface of the silicon wafer with one or more of $H_2SO_4/H_2O_2$, acetone, ethanol, and/or de-ionized water; and
drying the silicon wafer.

3. The method as recited in claim 1, wherein the silicon wafer is a mono-crystalline silicon wafer having an effective sheet resistance in a range from approximately 5 Ω/□ to approximately 10 Ω/□.

4. The method as recited in claim 1, wherein the silicon wafer is a P-type highly doped wafer with an effective sheet resistance that is less than approximately 10 Ω/□.

5. The method as recited in claim 1, wherein the galvanic displacement process comprises:
preparing an etchant for the galvanic displacement process, wherein the etchant has a mixing ratio of about 35 mM/L of silver nitrate ($AgNO_3$) and about 20% of hydrofluoric acid (HF).

6. The method as recited in claim 5, wherein the etching with the galvanic displacement process further comprises:
placing the etchant inside a container;
immersing the silicon wafer in the container with the etchant; and
sealing the container.

7. The method as recited in claim 6, wherein the etching with the galvanic displacement process further comprises:
maintaining the silicon wafer in the sealed container for an elapsed time of about 15 minutes or more.

8. The method as recited in claim 7, wherein the etching with the galvanic displacement process further comprises:
removing the silicon wafer from the container;
cleaning the silicon wafer to provide a cleaned silicon wafer; and
removing residual etchant from the cleaned silicon wafer.

9. The method as recited in claim 5, wherein etching with the galvanic displacement process further comprises:
immersing the silicon wafer in the etchant for an elapsed time of at least 15 minutes.

10. An electric double-layer ultra-capacitor, comprising:
a first electrode and a second electrode configured in cooperative operation, wherein
each of the first electrode and the second electrode have a respective nano-structure that contains a plurality of nano-wires with a height-to-diameter ratio that is above a first predetermined threshold of about 100:1,
the first electrode's nano-structure and the second electrode's nano-structure are configured to face each other, and
a distance between the first electrode's nano-structure and the second electrode's nano-structure is smaller than a second predetermined threshold of about 0.5 µm.

11. The electric double-layer ultra-capacitor as recited in claim 10, wherein the first electrode's nano-structure and the second electrode's nano-structure are constructed based on a highly-doped silicon wafer with a sheet resistance that is less than about 10 Ω/□.

12. The electric double-layer ultra-capacitor as recited in claim 10, wherein the plurality of nano-wires are silicon-based.

13. The electric double-layer ultra-capacitor as recited in claim 10, wherein the first electrode's nano-structure and the second electrode's nano-structure are constructed using a galvanic displacement process.

14. The electric double-layer ultra-capacitor as recited in claim 13, wherein the first electrode's nano-structure and the second electrode's nano-structure are etched from silicon substrates by the galvanic displacement process.

* * * * *